US008264850B2

(12) United States Patent
So et al.

(10) Patent No.: US 8,264,850 B2
(45) Date of Patent: Sep. 11, 2012

(54) ELECTRONIC DEVICE PACKAGE WITH CONNECTION TERMINALS INCLUDING UNEVEN CONTACT SURFACES

(75) Inventors: Tsuyoshi So, Kawasaki (JP); Hideki Maeda, Kawasaki (JP); Osamu Aizawa, Kawasaki (JP); Hideo Kubo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 457 days.

(21) Appl. No.: 12/414,535

(22) Filed: Mar. 30, 2009

(65) Prior Publication Data

US 2009/0242258 A1    Oct. 1, 2009

(30) Foreign Application Priority Data

Mar. 31, 2008   (JP) ................................. 2008-091507

(51) Int. Cl.
*H05K 7/10* (2006.01)
(52) U.S. Cl. ...................................................... 361/767
(58) Field of Classification Search .................. 361/767; 257/737, 738; 439/83
See application file for complete search history.

(56) References Cited

U.S. PATENT DOCUMENTS

| | | | | |
|---|---|---|---|---|
| 4,442,966 A * | 4/1984 | Jourdain et al. | ........... | 228/122.1 |
| 4,836,435 A * | 6/1989 | Napp et al. | ........... | 228/180.22 |
| 5,121,299 A * | 6/1992 | Frankeny et al. | ........... | 361/785 |
| 5,229,646 A * | 7/1993 | Tsumura | ........... | 257/782 |
| 5,340,639 A * | 8/1994 | Nakamura | ........... | 428/192 |
| 5,371,328 A * | 12/1994 | Gutierrez et al. | ........... | 174/261 |
| 5,446,244 A * | 8/1995 | Kawanabe et al. | ........... | 174/261 |
| 5,483,421 A * | 1/1996 | Gedney et al. | ........... | 361/771 |
| 5,519,251 A * | 5/1996 | Sato et al. | ........... | 257/666 |
| 5,545,589 A * | 8/1996 | Tomura et al. | ........... | 438/119 |
| 5,828,128 A * | 10/1998 | Higashiguchi et al. | ........... | 257/738 |
| 5,936,309 A * | 8/1999 | Kim | ........... | 257/779 |
| 6,005,290 A * | 12/1999 | Akram et al. | ........... | 257/723 |
| 6,083,666 A * | 7/2000 | Kim | ........... | 430/315 |
| 6,172,422 B1 * | 1/2001 | Chigawa et al. | ........... | 257/778 |
| 6,177,731 B1 * | 1/2001 | Ishida et al. | ........... | 257/780 |
| 6,201,301 B1 * | 3/2001 | Hoang | ........... | 257/712 |
| 6,285,560 B1 * | 9/2001 | Lyne | ........... | 361/760 |
| 6,303,880 B1 * | 10/2001 | Asai et al. | ........... | 174/263 |
| 6,369,451 B2 * | 4/2002 | Lin | ........... | 257/779 |
| 6,426,880 B1 * | 7/2002 | Chen | ........... | 361/773 |
| 6,462,283 B1 * | 10/2002 | Hirai et al. | ........... | 174/260 |

(Continued)

FOREIGN PATENT DOCUMENTS

JP    2000-200798 A    7/2000

(Continued)

OTHER PUBLICATIONS

Office Action dated Nov. 8, 2011, mailed by Japan Patent Office for corresponding Japanese Application No. 2008-091507, with partial translation.

*Primary Examiner* — Amy Cohen Johnson
*Assistant Examiner* — Vladimir Imas
(74) *Attorney, Agent, or Firm* — Fujitsu Patent Center

(57) ABSTRACT

An electronic device package includes an electronic device including a plurality of input/output terminals, a wiring board which places the electronic device on a first surface and includes wiring connected to the input/output terminals of the electronic device, and a first connection terminal formed on a second surface of the wiring board and connected to the wiring, wherein the first connection terminal has an uneven contact surface formed to receive solder material placed thereon.

8 Claims, 18 Drawing Sheets

U.S. PATENT DOCUMENTS

| | | | |
|---|---|---|---|
| 6,734,671 B2 * | 5/2004 | Murata et al. | 324/252 |
| 7,414,317 B2 | 8/2008 | Lee | |
| 7,719,853 B2 * | 5/2010 | Shih | 361/767 |
| 7,799,614 B2 * | 9/2010 | Otremba et al. | 438/125 |
| 7,964,962 B2 * | 6/2011 | Watanabe et al. | 257/737 |
| 2003/0133274 A1 * | 7/2003 | Chen et al. | 361/760 |
| 2005/0207131 A1 * | 9/2005 | Prokofiev et al. | 361/760 |
| 2008/0225500 A1 * | 9/2008 | Kuroda et al. | 361/767 |
| 2009/0020873 A1 * | 1/2009 | Watanabe et al. | 257/737 |

FOREIGN PATENT DOCUMENTS

| | | |
|---|---|---|
| JP | 2001-110940 A | 4/2001 |
| JP | 2006-24889 A | 1/2006 |
| WO | WO99/36957 | 7/1999 |

* cited by examiner

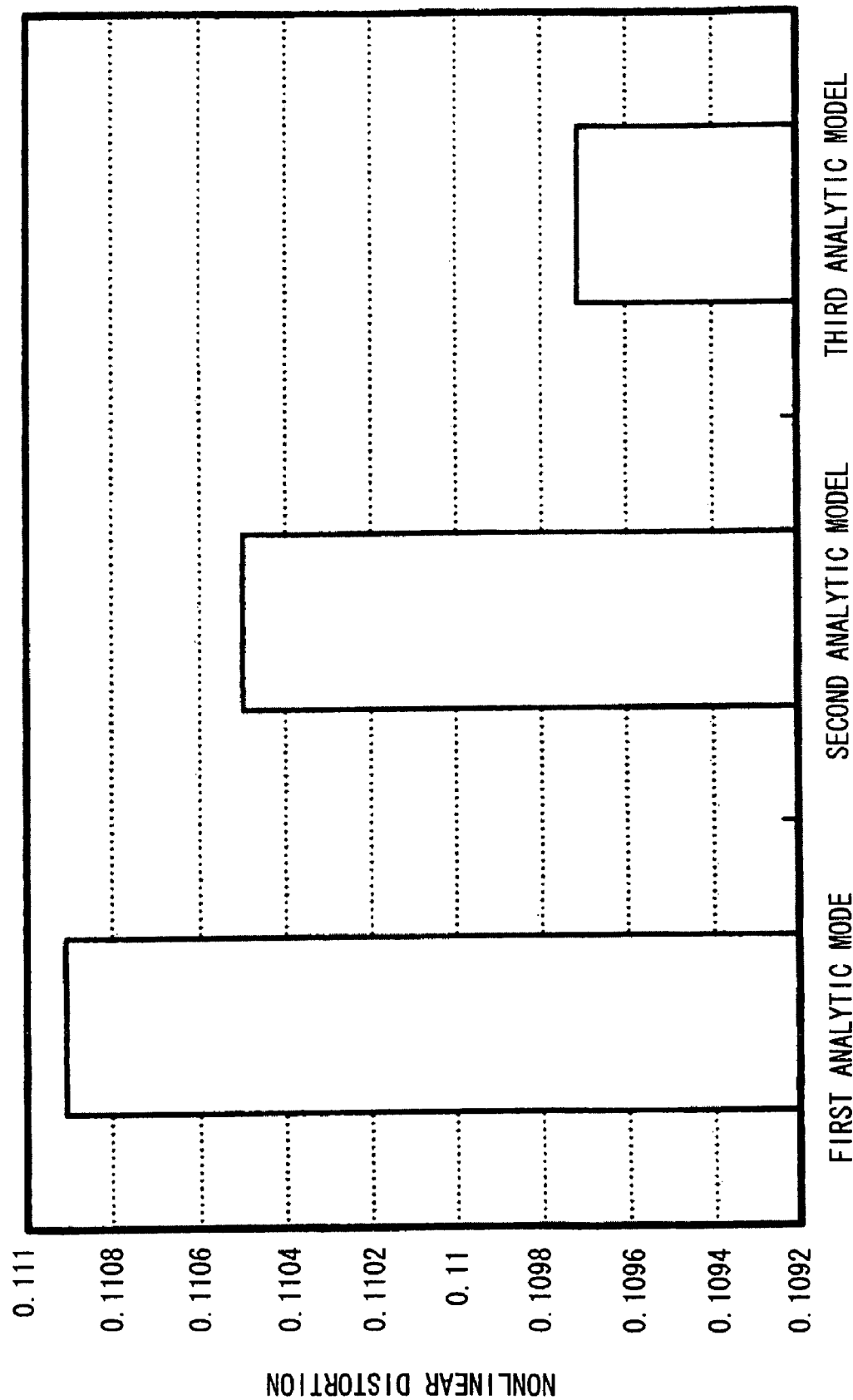

US 8,264,850 B2

ELECTRONIC DEVICE PACKAGE WITH CONNECTION TERMINALS INCLUDING UNEVEN CONTACT SURFACES

CROSS-REFERENCE TO RELATED APPLICATIONS

This application is based upon and claims priority to prior Japanese Patent Application No. 2008-91507 filed on Mar. 31, 2008 in the Japan Patent Office, the entire contents of which are incorporated herein by reference.

FIELD

An embodiment of the invention discussed herein relates to an electronic device package, a board unit, a printed wiring board, and a method for producing the printed wiring board.

BACKGROUND

Electronic device packages such as BGA (Ball Grid Array) semiconductor packages are well known. Such a BGA semiconductor package has a package board, for example, made of ceramic. An electronic device such as an LSI chip is mounted on the package board. The BGA semiconductor package is mounted on a printed wiring board, for example, made of resin. A solder material such as BGA balls (or solder balls) is used for mounting the BGA semiconductor package on the printed wiring board. The respective BGA balls are joined to conductor pads on the package board side and conductor pads on the printed wiring board.

[Patent Document 1] Japanese Laid-open Patent Publication No. 2001-110940

[Patent Document 2] Japanese Laid-open Patent Publication No. 2006-24889

[Patent Document 3] International Publication Pamphlet WO 99/36957

SUMMARY

According to an aspect of the invention, an electronic device package includes an electronic device including a plurality of input/output terminals, a wiring board which places the electronic device on a first surface and includes wiring connected to the input/output terminals of the electronic device, and a first connection terminal formed on a second surface of the wiring board and connected to the wiring, wherein the first connection terminal has an uneven contact surface formed to receive solder material placed thereon.

BRIEF DESCRIPTION OF DRAWINGS

FIG. 18 is a graph depicting a result of verification based on the computer simulation.

DESCRIPTION OF EMBODIMENTS

Embodiments of the invention will be described below with reference to the accompanying drawings.

Figure 1:
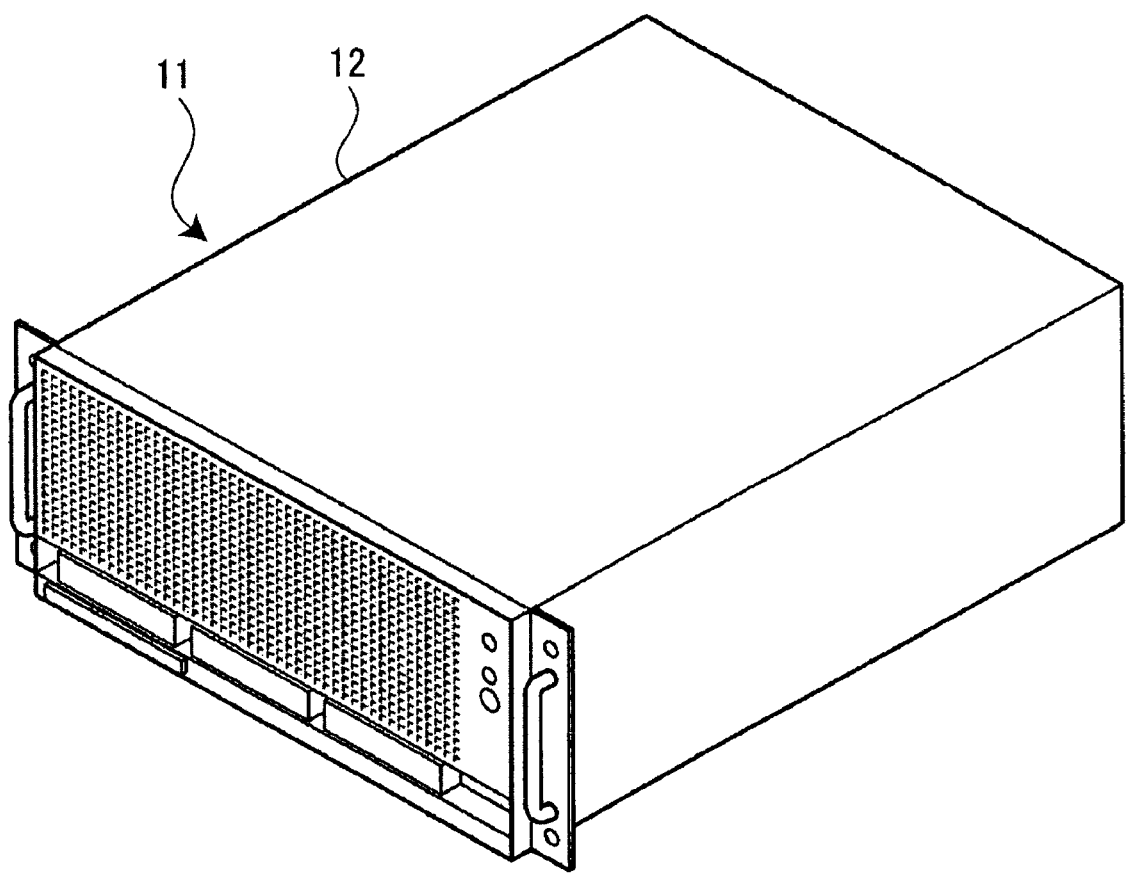
FIG. 1 depicts a perspective view schematically depicting the external appearance of a server computer apparatus as a specific example of an electronic apparatus according to an embodiment of the invention.

FIG. 1 schematically depicts the external appearance of a server computer apparatus 11 as an example of an electronic apparatus according to an embodiment of the invention. The server computer apparatus 11 has a chassis 12. The chassis 12 includes a housing space. A mother board is disposed in the housing space. Semiconductor devices such as a BGA semiconductor package, etc. and a main memory are mounted on the mother board. The BGA semiconductor package performs various arithmetic operations, for example, based on software programs and data temporarily stored in the main memory. The software programs and data may be stored in a mass data storage apparatus such as a hard disk drive (HDD) disposed in the housing space. For example, the server computer apparatus 11 may be mounted on a rack.

Figure 2:
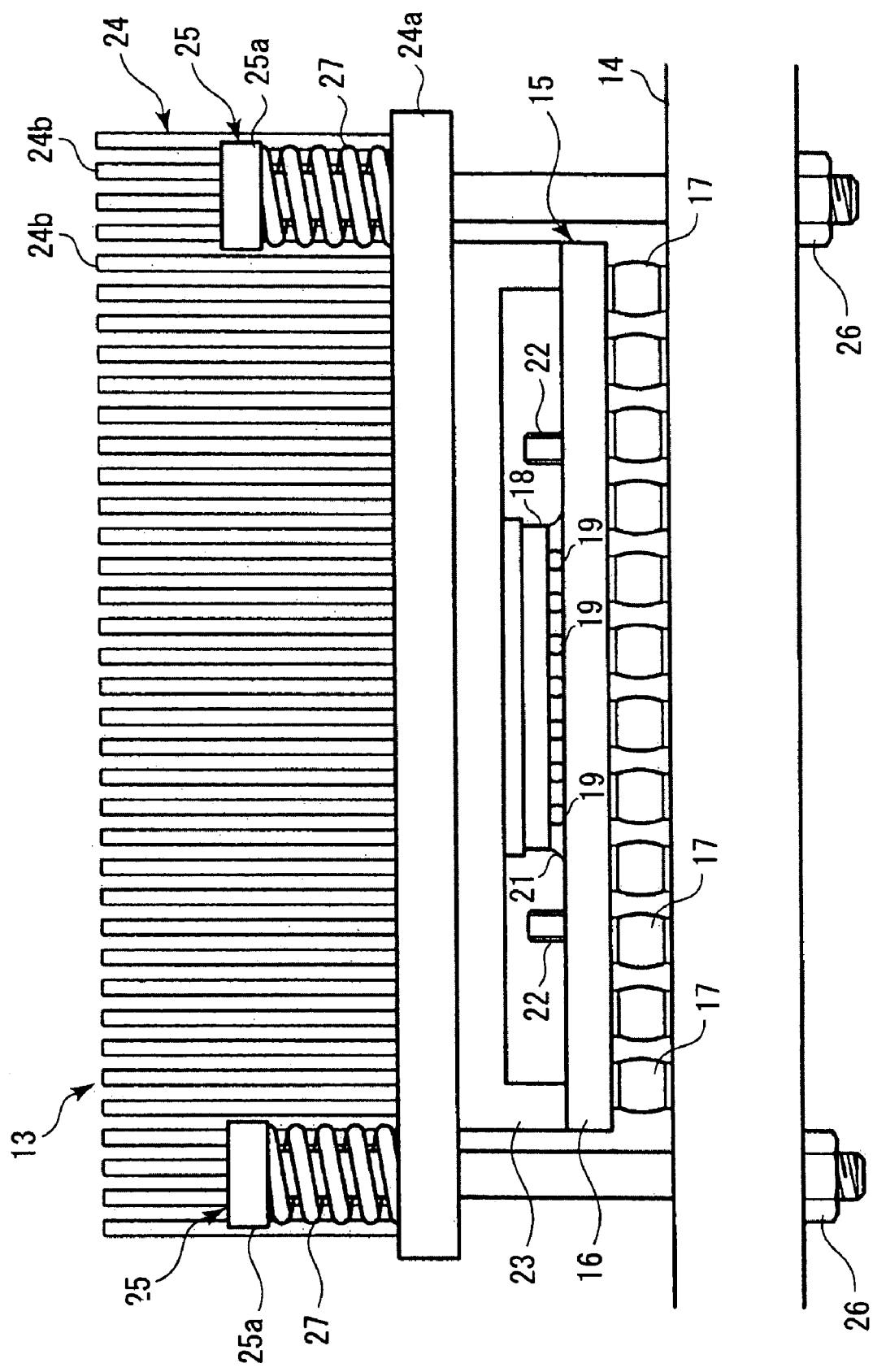
FIG. 2 is a side view schematically depicting the structure of a mother board as a printed board unit according to an embodiment of the invention.

As depicted in FIG. 2, according to an embodiment of the invention, the mother board 13, which is a printed board unit, has a large-size printed wiring board 14. For example, the thickness of the printed wiring board 14 may be set at 3.6 mm. An LSI (large scale integrated circuit) chip package 15, which is a BGA semiconductor package, is mounted on a front surface of the printed wiring board 14. The LSI chip package 15 has a package board 16. For example, a ceramic board may be used as the package board 16. The package board 16 has a polygonal contour. In this embodiment, the package board 16 is shaped into a square contour. For example, the length of each side may be set at 47.5 mm. For example, the thickness of the package board 16 may be set at 1.7 mm.

A plurality of terminal bumps 17, that is BGA balls, are provided in the inside of the contour of the package board 16 so as to be arranged on the front surface of the printed wiring board 14. The terminal bumps 17 are made of a solder material. For example, lead-free solder may be used as the solder material. For example, the lead-free solder may be made of an alloy of tin, silver, and copper. The terminal bumps 17 receive the package board 16. In this manner, the package board 16 is joined to the front surface of the printed wiring board 14 by the terminal bumps 17. The terminal bumps 17 make up a terminal bump group. In this embodiment, the terminal bumps 17 are arranged in 46 rows and 46 columns. For example, the pitches of each row and column may be set at 1 mm. For example, the height of each terminal bump 17 may be set at about 0.4 mm.

An electronic device, that is, an LSI chip 18, is mounted on a front surface of the package board 16. For example, the LSI chip 18 may have a square contour. For example, the length of each side of the LSI chip 18 may be set at 18 mm. Terminal bumps 19 are arranged in matrix on the front surface of the package board 16. The terminal bumps 19 receive the LSI chip 18. A plurality of input/output signal lines is formed in the LSI chip 18. The input/output signal lines are each connected to the terminal bumps 19. In this manner, the input/output signal lines are led out of the LSI chip 18. The terminal bumps 19 are sealed on the package board 16. That is, a space between the LSI chip 18 and the package board 16 is filled with a resin material 21. Other electronic devices 22 such as chip capacitors and chip resistors may be mounted on the package board 16.

The front surface of the package board 16 receives a heat spreader 23 which is a heat conductor device. The heat spreader 23 is brazed to the front surface of the package board 16, for example, by a solder material. The heat spreader 23 is made of a metal material such as copper. The heat spreader 23 is in contact with a front surface of the LSI chip 18. The front surface of the LSI chip 18 is brazed to a downward surface of the heat spreader 23, for example, by a solder material. In this manner, heat energy of the LSI chip 18 is transferred to the heat spreader 23 efficiently.

The heat spreader 23 receives a heat sink 24 which is a heat radiator device. The heat sink 24 has a flat base plate 24a. A flat downward surface of the base plate 24a is laid to overlap an upward surface of the heat spreader 23. For example, a heat conducting seat (not depicted) may be sandwiched between the base plate 24a and the heat spreader 23. A plurality of fins 24b is fixed to the base plate 24a. Each of the fins 24b rise vertically from the upward surface of the base plate 24a. The fins 24b are arranged in parallel to one another. Air paths extending in one direction are formed between adjacent fins 24b. The base plate 24a and the fins 24b may be molded of a metal material such as aluminum or copper. Heat energy from the heat spreader 23 is transmitted to the heat sink 24. The heat energy is radiated from the heat sink 24 to the air.

The heat sink 24 is connected to the printed wiring board 14. For example, four bolts 25 may be used for the connection. The bolts 25 are disposed diagonally at each of the outside four corners of the package board 16. The bolts 25 pass through the base plate 24a of the heat sink 24 and the printed wiring board 14. Nuts 26 are screwed to leading ends of each of the bolts 25 on the rear side of the printed wiring board 14. The bolts 25 are provided with helical coiled springs 27 respectively so that each helical coiled spring 27 is put between a head 25a of the bolt 25, that is, a flange and the base plate 24a. The helical coiled springs 27 exhibit elastic force to keep the heads 25a of the bolts 25 apart from the base plate 24a. As a result, the base plate 24a is pressed against the heat spreader 23 of the LSI chip package 15.

Figure 3:
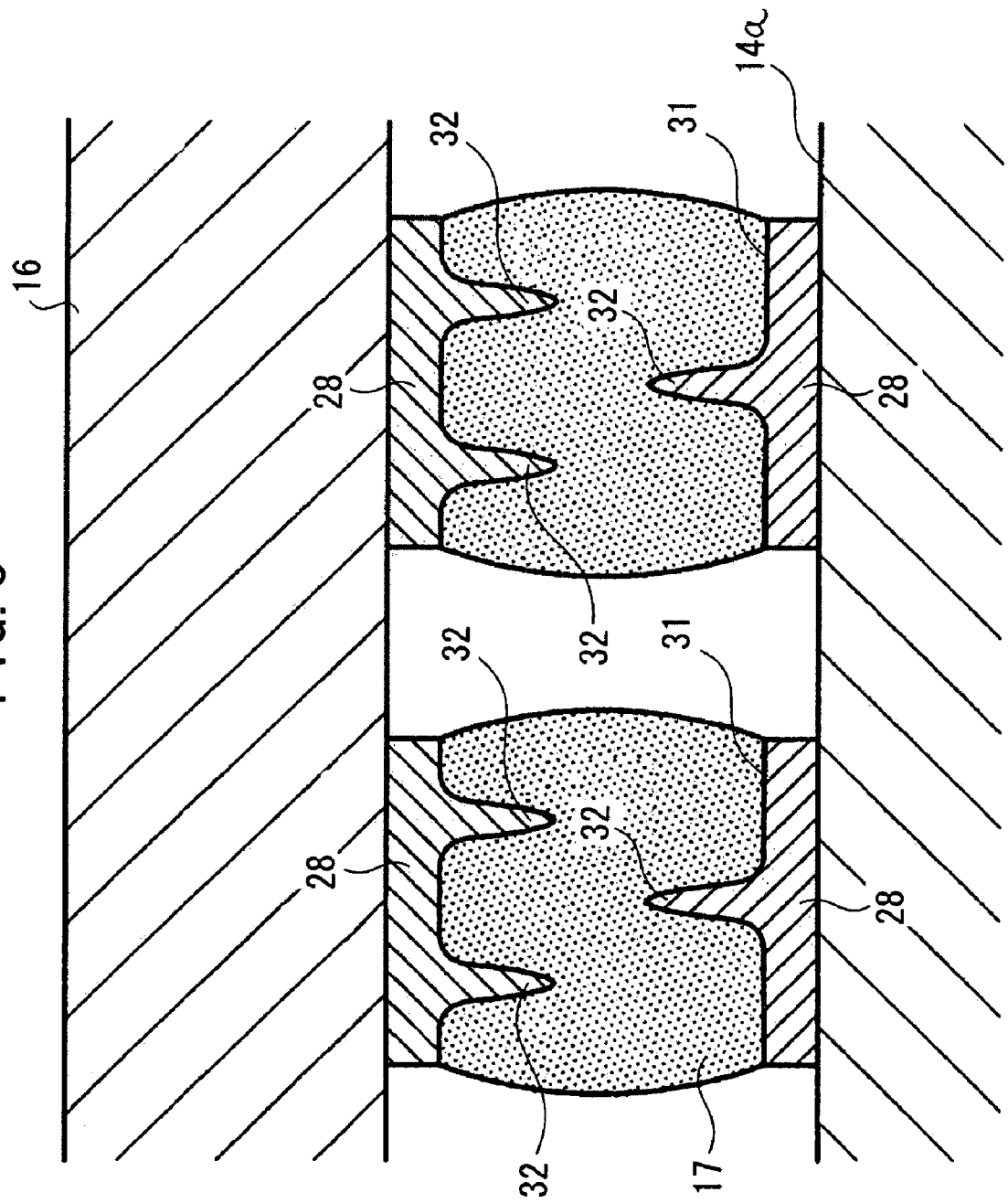
FIG. 3 is an enlarged vertical sectional view of a mother board, schematically depicting conductor pads according to a first embodiment of the invention.

As depicted in FIG. 3, the printed wiring board 14 has a board 14a. The board 14a is made of a resin material. Connection terminals, that is, conductor pads 28, according to a first embodiment of the invention, are formed on a front surface, that is, a flat surface of the board 14a. Each conductor pad 28 is shaped like a disk. For example, the diameter of the disk may be set at 0.6 mm. Front surfaces of the conductor pads 28 are shaped in uneven form. That is, one or more protrusions 32 are formed on a flat base surface 31 of each conductor pad 28. For example, each protrusion 32 may be shaped like a horn. In this embodiment, for example, the height of each protrusion 32 may be set at 0.03 mm from the base surface 31 of a corresponding conductor pad 28 which is 0.01 mm thick. For example, the diameter of the base of each protrusion 32 may be set at about 0.05 mm. Accordingly, the protrusions 32 can be distinguished from surface roughness of the base surface 31 and the protrusions 32. The front surface of the conductor pads 28 receives a terminal bump 17. The protrusions 32 extend into the terminal bumps 17. The front surface of the board 14a receives the rear surfaces of the conductor pads 28. Each conductor pad 28 is made of a conductor material such as copper. Conductor pads 28 are formed on a rear surface of the package board 16 corresponding to the conductor pads 28 on the front surface of the board 14a. The conductor pads 28 are connected to the input/output signal lines of the LSI chip 18 through wiring in the package board 16. Each pair of conductor pads 28 is coupled by a corresponding terminal bump 17. A contact surface shaped in an uneven form is established between each terminal bump 17 and a corresponding conductor pad 28. The conductor pads 28 may be formed in wiring patterns which are formed on the front surface of the printed wiring board 14 and on the rear surface of the package board 16.

Figure 4:
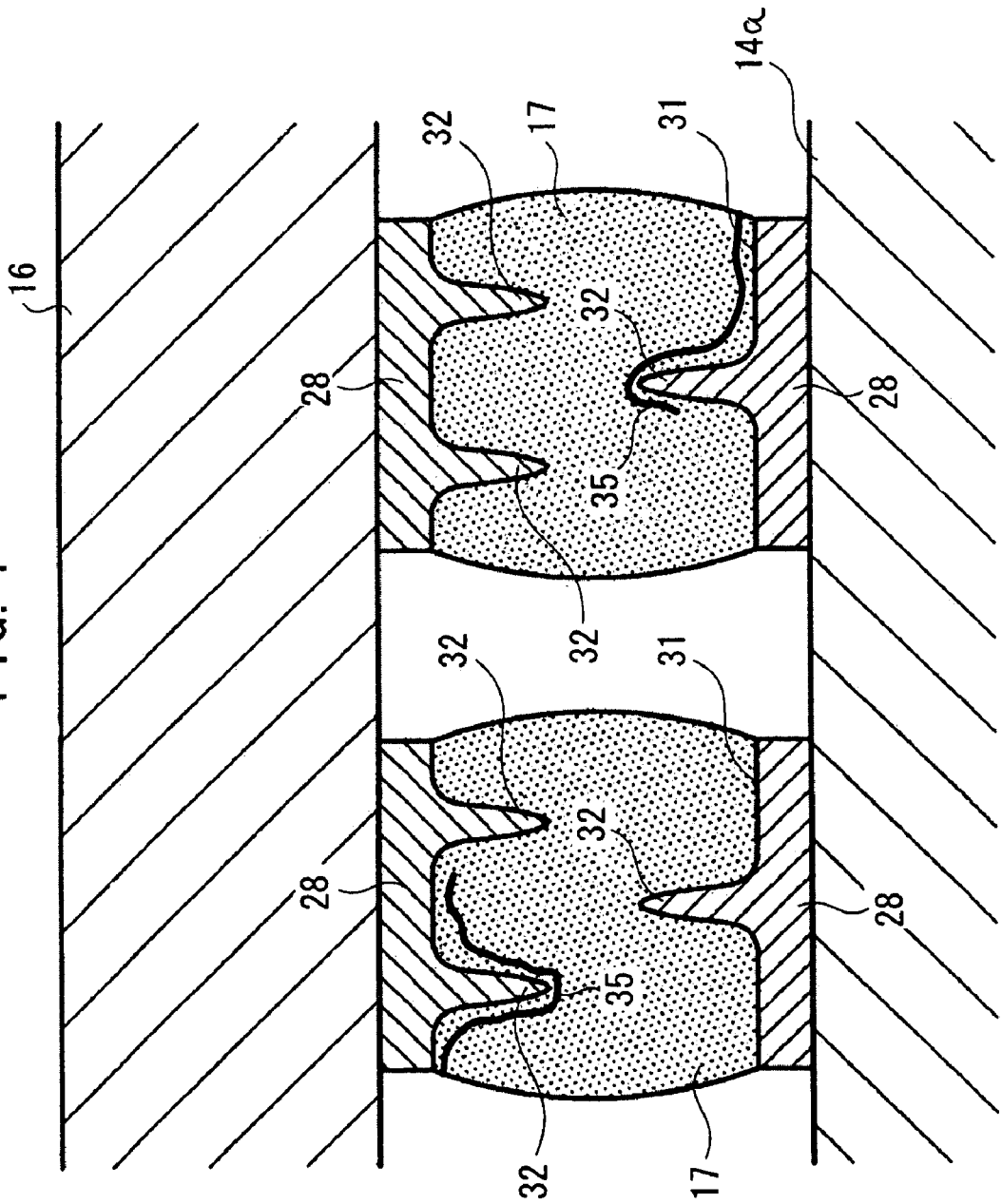
FIG. 4 is a partly enlarged vertical sectional view of a mother board, schematically depicting the progress of cracking in terminal bumps.

In such a mother board 13, the LSI chip 18 generates heat during operation. The generated heat causes thermal expansion of the package board 16 and the printed wiring board 14. Because the coefficient of thermal expansion of ceramic is different from the coefficient of thermal expansion of resin, a thermal expansion difference is generated between the package board 16 and the printed wiring board 14. Shearing stress is generated in the terminal bumps 17 based on the thermal expansion difference between the package board 16 and the printed wiring board 14. Maximum shearing stress is generated in the terminal bumps 17 particularly at the four corners of the arrangement of the terminal bump group. When, for example, the operation of the LSI chip 18 is turned on and off, heating and cooling is repeated in the LSI chip 18. As a result, cracking occurs in the terminal bumps 17 at the four corners in accordance with the thermal expansion difference. The cracking grows along front surfaces of the conductor pads 28. However, the protrusions 32 of the conductor pads 28 extend into the terminal bumps 17 as described above. Consequently, as depicted in FIG. 4, the growth of cracking 35 meanders due to the protrusions 32. The growth of cracking 35 is suppressed. Electric connection between each pair of conductor pads 28 is maintained. In the background art, occurrence of cracking in the four-corner terminal bumps 17 was considered. Consequently, the four-corner conductor pads were used as dummy pads. The term "dummy pads" means pads which are not connected to the input/output signal lines of the LSI chip 18.

Figure 5:
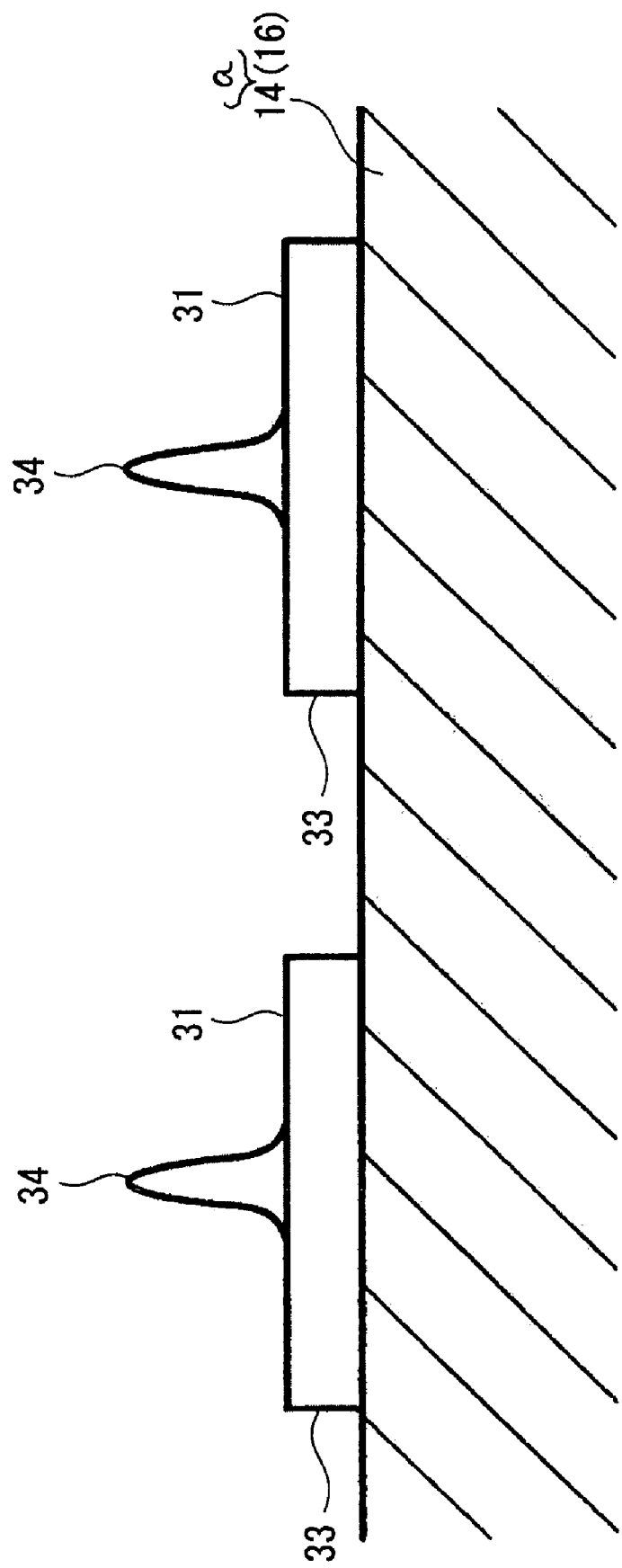
FIG. 5 is a side view of conductor pads, schematically depicting a process of production of the conductor pads.

A method of producing conductor pads 28 will be described below. A printed wiring board 14 and a package board 16 are prepared. Wiring patterns are formed on surfaces of the printed wiring board 14 and the package board 16 in advance. Pads 33 for forming base surfaces 31 of conductor pads 28 are formed in each wiring pattern. As depicted in FIG. 5, conductor paste 34 is built up on each base surface 31 so as to be shaped like a horn. The conductor paste 34 contains fine particles of a metal such as copper. When the conductor paste 34 is heated, a binder, e.g., a thermosetting resin, in the conductor paste 34 is hardened. In this manner, protrusions 32 are formed.

Figure 6:
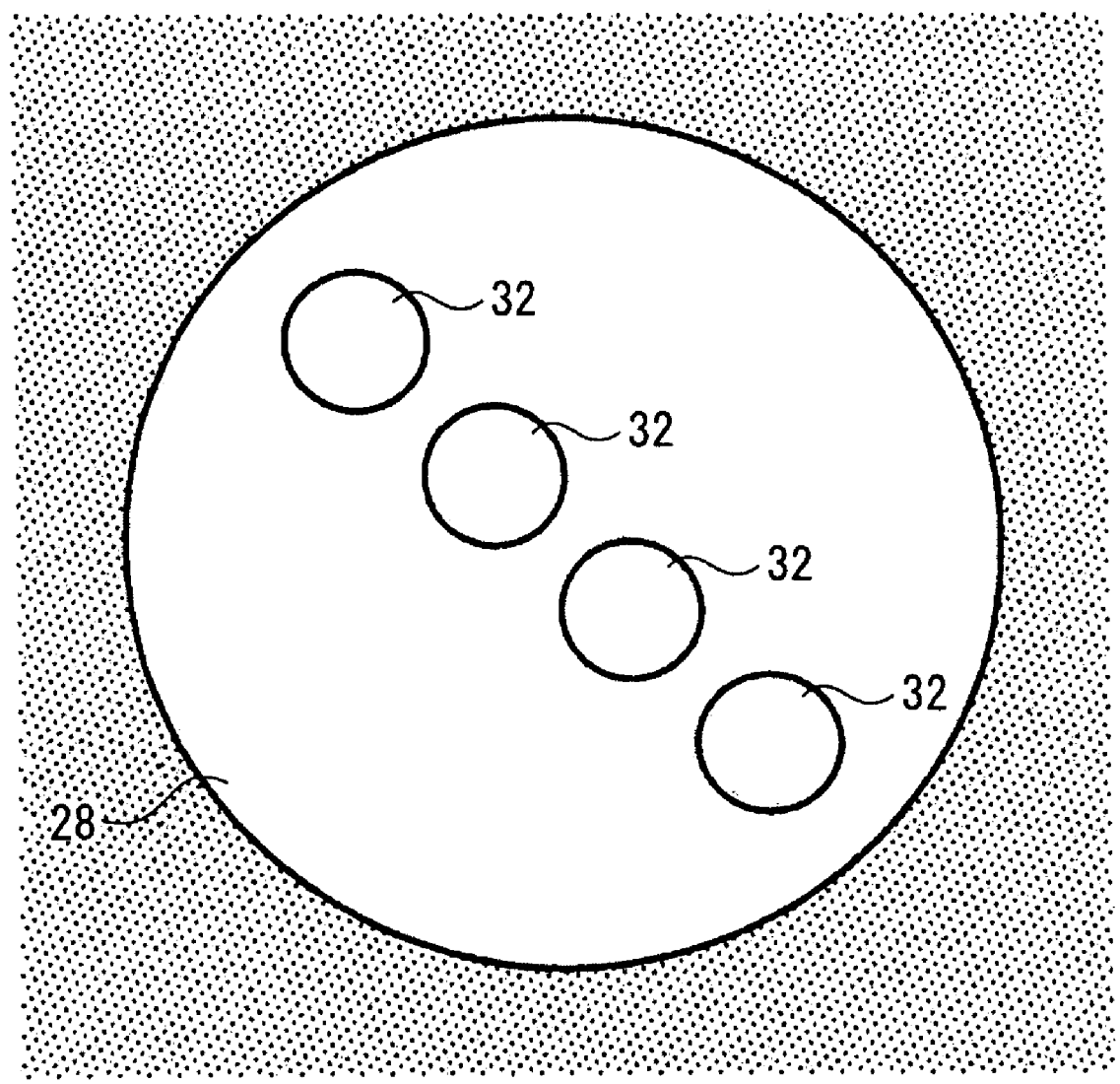
FIG. 6 depicts an enlarged plan view of a conductor pad.

As depicted in FIG. 6, a plurality of protrusions 32 may be arranged in a line on each conductor pad 28. When the protrusions 32 are arranged in the directions of expansion and contraction at the time of thermal expansion in this manner, the growth of cracking 35 will be reliably suppressed. Electric connections between each pair of conductor pads 28 may be reliably maintained.

Figure 7:
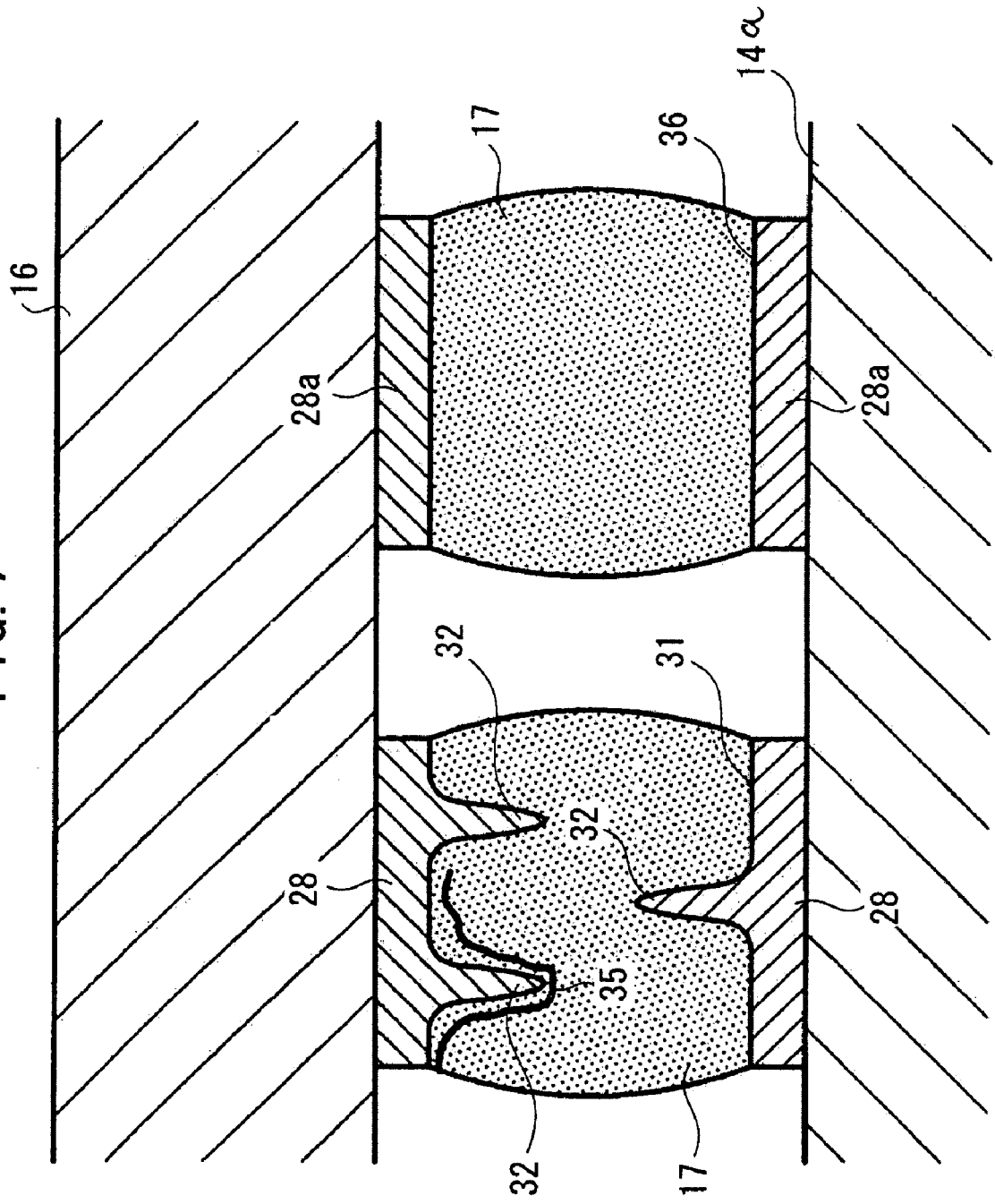
FIG. 7 is an enlarged vertical sectional view, schematically depicting a conductor pad according to the first embodiment of the invention and a typical conductor pad.

Alternatively, as depicted in FIG. 7, for example, general conductor pads 28a may be combined with the aforementioned conductor pads 28 in the printed wiring board 14 and the package board 16. Each conductor pad 28a is shaped like a disk. For example, the diameter of the disk may be set at 0.6 mm. For example, the thickness of each conductor pad 28a may be set at 0.01 mm. A front surface of each conductor pad 28a is formed as a plain flat surface 36. The surface roughness of the flat surfaces 36 is set to be equal to the surface roughness of the base surfaces 31 and the protrusions 32. The front surface of each conductor pad 28a receives a terminal bump 17. The front surface of the printed wiring board 14 receives the rear surfaces of the conductor pads 28a. The conductor pads 28a are made of a conductor material such as copper. Conductor pads 28a paired with the conductor pads 28a are formed on the rear surface of the package board 16. The conductor pads 28a are connected to the input/output signal lines of the LSI chip 18. Each pair of conductor pads 28a is coupled by a corresponding terminal bump 17.

Figure 8:
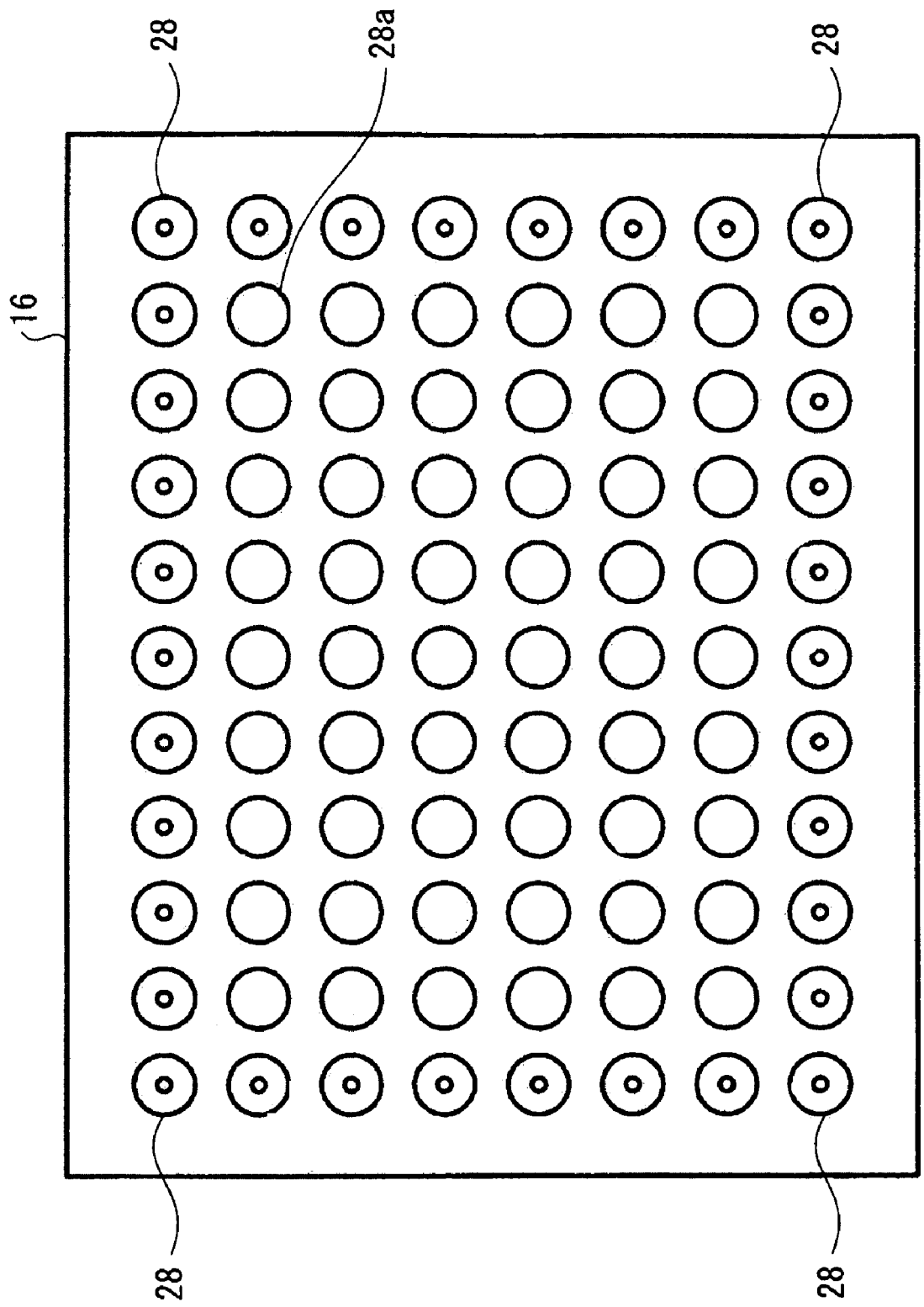
FIG. 8 is a rear view of a package board, schematically depicting arrangement of conductor pads.

As depicted in FIG. 8, the aforementioned conductor pads 28 may be disposed along the contour of the package board 16. The conductor pads 28 are disposed in positions corresponding to the arrangement of the outermost circumference of the terminal bump group. For example, the conductor pads 28 are located in an arrangement along the outermost circumference of the terminal bump group. Conductor pads 28 are disposed on the printed wiring board 14 corresponding to the conductor pads 28 formed on the package board 16. General conductor pads 28a corresponding to terminal bumps 17 are disposed on the package board 16 and the printed wiring board 14, except for the arrangement at the outermost circumference. In the terminal bumps 17 on the outermost circumference, the growth of cracking 35 meanders due to the protrusions 32. The growth of cracking 35 is suppressed. Electric connection between each pair of conductor pads 28 is maintained. All the conductor pads 28 and 28a may be used for electric connection.

Figure 9:
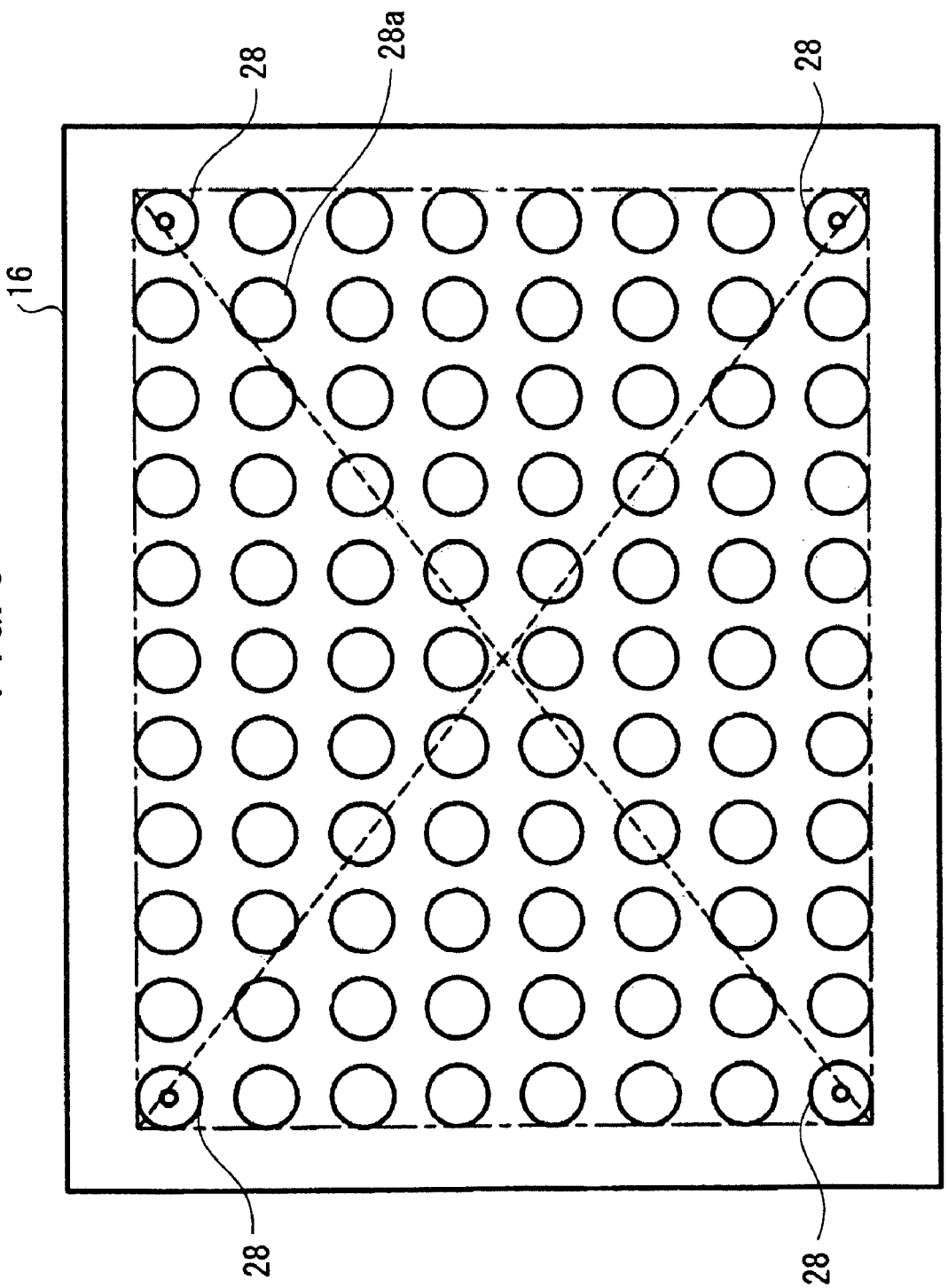
FIG. 9 is a rear view of a package board, schematically depicting arrangement of conductor pads.

For example, as depicted in FIG. 9, the aforementioned conductor pads 28 may be disposed at the four corners of the package board 16. That is, the conductor pads 28 are disposed in positions corresponding to the four corners of the arrangement of the terminal bump group. Conductor pads 28 corresponding to the four conductor pads 28 are disposed on the printed wiring board 14. Conductor pads 28a corresponding to terminal bumps 17 except the four corners are disposed on the package board 16 and the printed wiring board 14. In the terminal bumps 17 on the four corners, the growth of cracking 35 meanders due to the protrusions 32. The growth of cracking 35 is suppressed. Electric connection between each pair of conductor pads 28 is maintained. All the conductor pads 28 and 28a may be used for electric connection. When the contour of the arrangement of the terminal bumps 17 is shaped like a polygon other than a quadrilateral, conductor pads 28 may be disposed on at least each corner of the polygon. Protrusions 32 may be provided on one conductor pad 28 so as to be arranged in a diagonal line.

Figure 10:
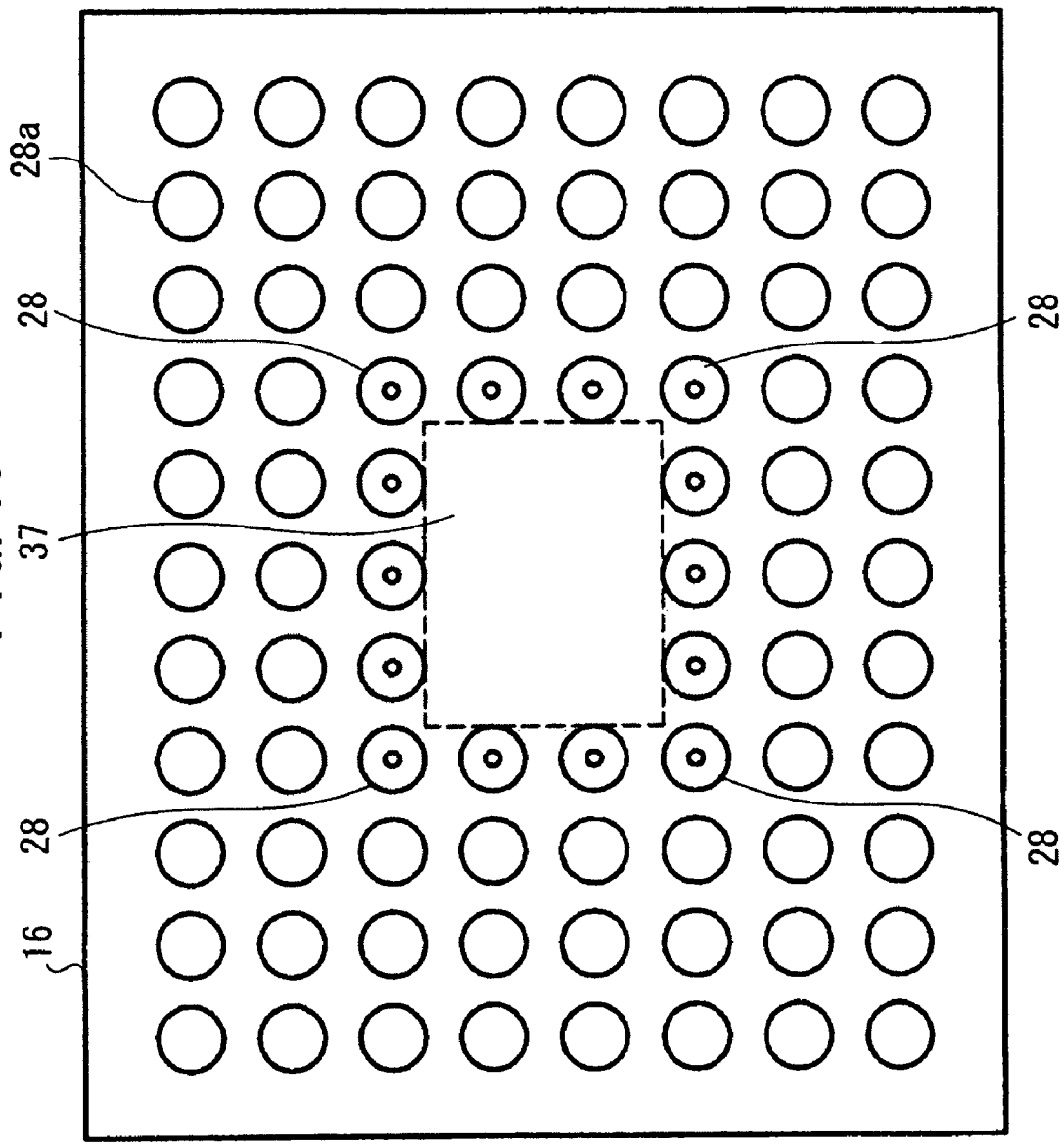
FIG. 10 is a rear view of a package board, schematically depicting arrangement of conductor pads.

For example, as depicted in FIG. 10, the arrangement of terminal bumps 17 in the terminal bump group may be reduced by a specific number of rows and a specific number of columns. In this arrangement, a space 37 corresponding to the specific number of rows and the specific number of columns is surrounded by the terminal bumps 17. In this case, the aforementioned conductor pads 28 may be arranged on a line in a circumference around the space 37, that is, disposed in positions corresponding to the arrangement of the innermost circumference of the terminal bump group. In the conductor pads 28 on the innermost circumference, the growth of cracking 35 meanders because of the function of the protrusions 32. Thus, the growth of cracking 35 is suppressed. Electric connection between each pair of conductor pads 28 is maintained. All the conductor pads 28 and 28a may be used for electric connection.

Figure 11:
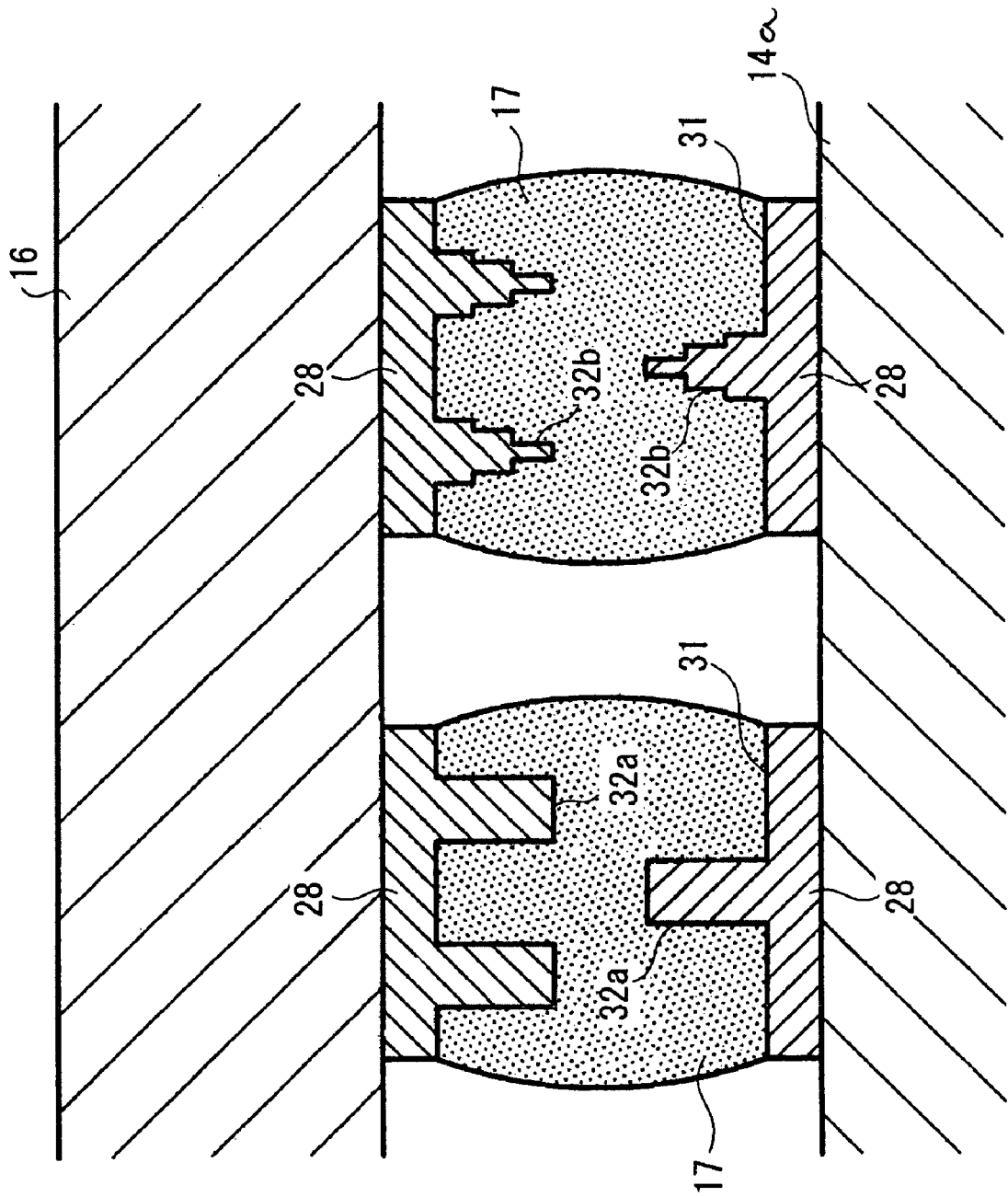
FIG. 11 is an enlarged vertical sectional view of a mother board, schematically depicting conductor pads according to a modification of the first embodiment.
Figure 12:
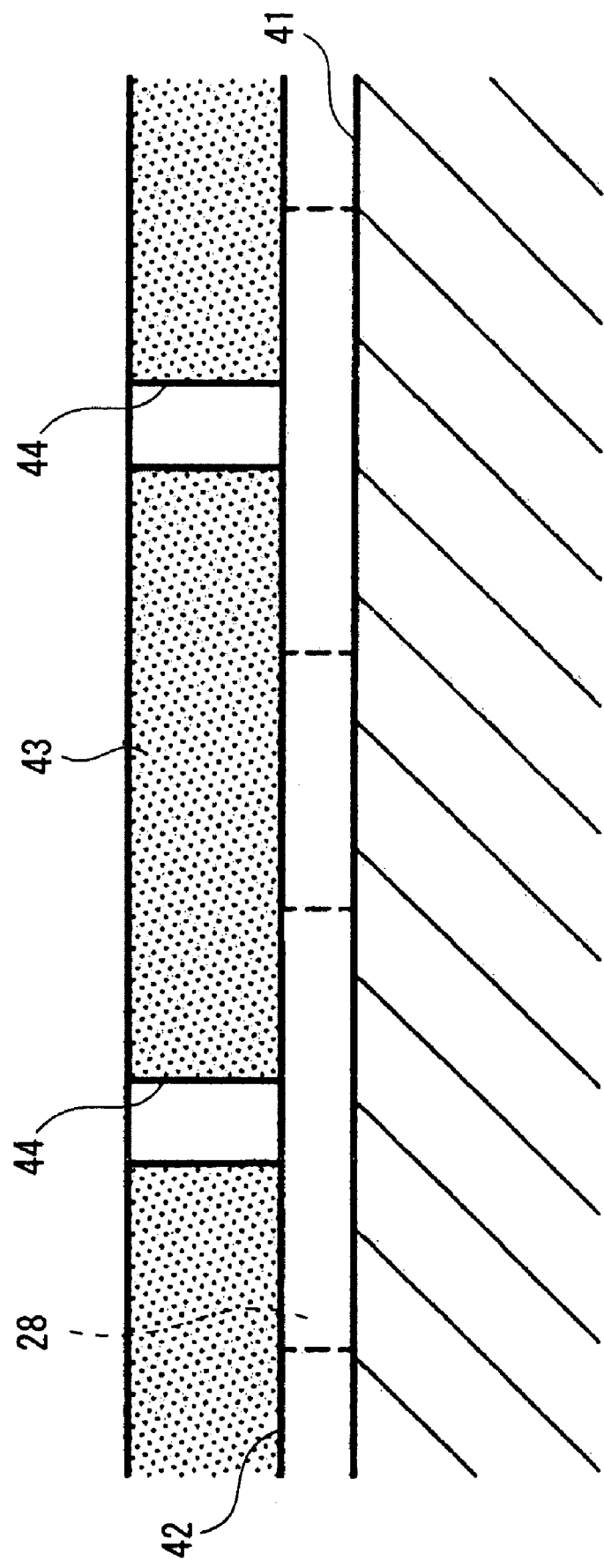
FIG. 12 is an enlarged vertical sectional view of a printed wiring board (or a package board), schematically depicting a process of production of protrusions.

Alternatively, as depicted in FIG. 11, rod-like protrusions 32a may be formed on the conductor pads 28. Similarly, stepped rod-like protrusions 32b may be formed on the conductor pads 28. The protrusions 32a or 32b may be formed when the printed wiring board 14 and the package board 16 are produced. As depicted in FIG. 12, for example, a wiring board material 41 is prepared for formation of the protrusions 32a or 32b. For example, the wiring board material 41 may be a resin board or a ceramic board. A cover film 42 made of a conductor material is formed on a front surface of the wiring board material 41. Protrusions 32a or 32b made of a conductor material are formed on a front surface of the cover film 42. The protrusions 32a or 32b are disposed in positions corresponding to the inside of the contours of the conductor pads 28. For example, photolithography may be used for formation of the protrusions 32a or 32b. That is, a resist film 43 is formed on a front surface of the cover film 42. Voids 44 corresponding to the protrusions 32a or 32b are formed in the resist film 43. Plating is applied based on the cover film 42. As a result, the protrusions 32a or 32b are formed in the voids 44 of the resist film 43. For formation of stepped protrusions, the resist films 43 may be applied repeatedly. The voids 44 in the resist film 43 may be narrowed whenever the resist film 43 is applied. After formation of the protrusions 32a or 32b, the resist film 43 is removed.

Figure 13:
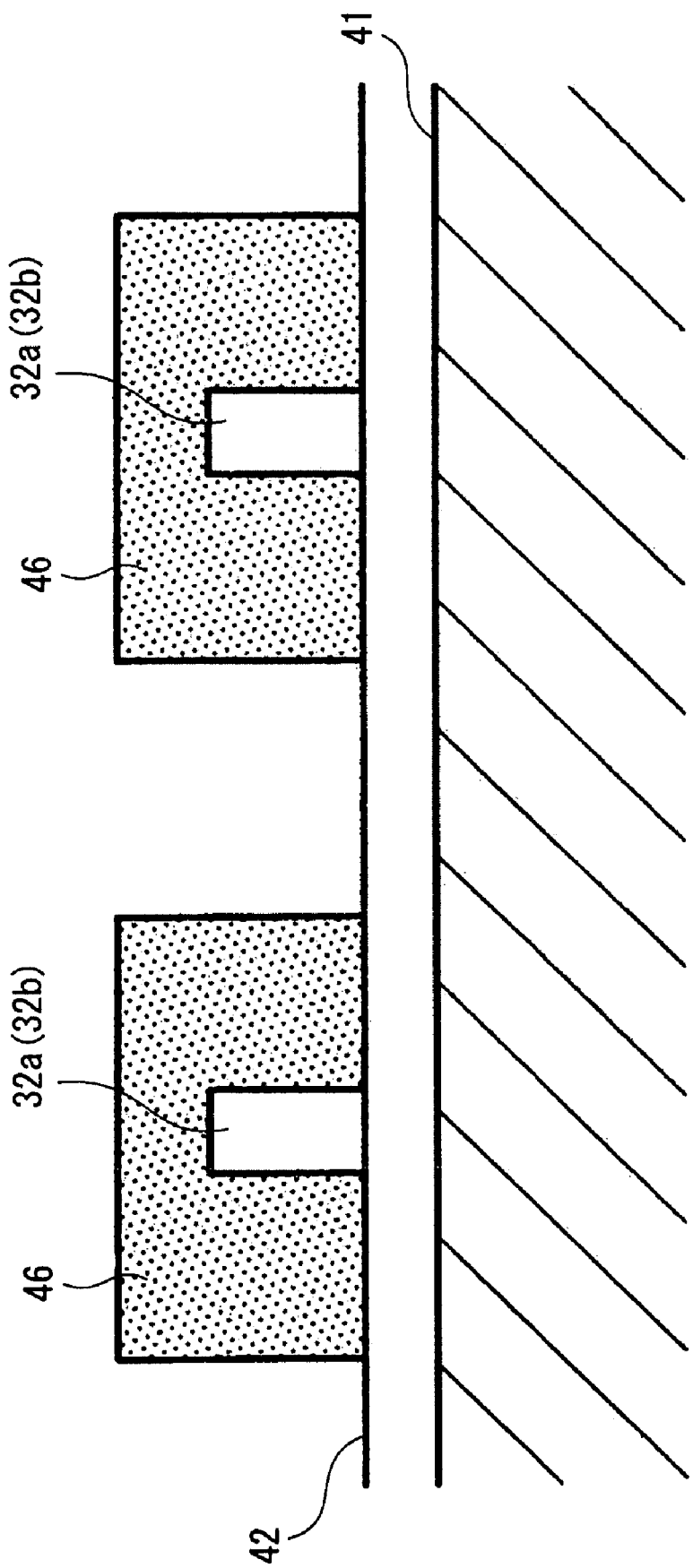
FIG. 13 is an enlarged vertical sectional view of a printed wiring board (or a package board), schematically depicting a process of production of a wiring pattern after production of the protrusions.

Then, as depicted in FIG. 13, a resist film 46 is formed again on the cover film 42. The resist film 46 models a wiring pattern including the pads 33. Protrusions 32a or 32b on the pads 33 are covered with the resist film 46. Etching is applied based on the resist film 46. As a result, the conductor material of the cover film 42 is removed from the periphery of the resist film 46. The wiring pattern of the conductor material remains under the resist film 46. Conductor pads 28 having protrusions 32a or 32b are formed in the wiring pattern. The resist film 46 is removed.

Figure 14:
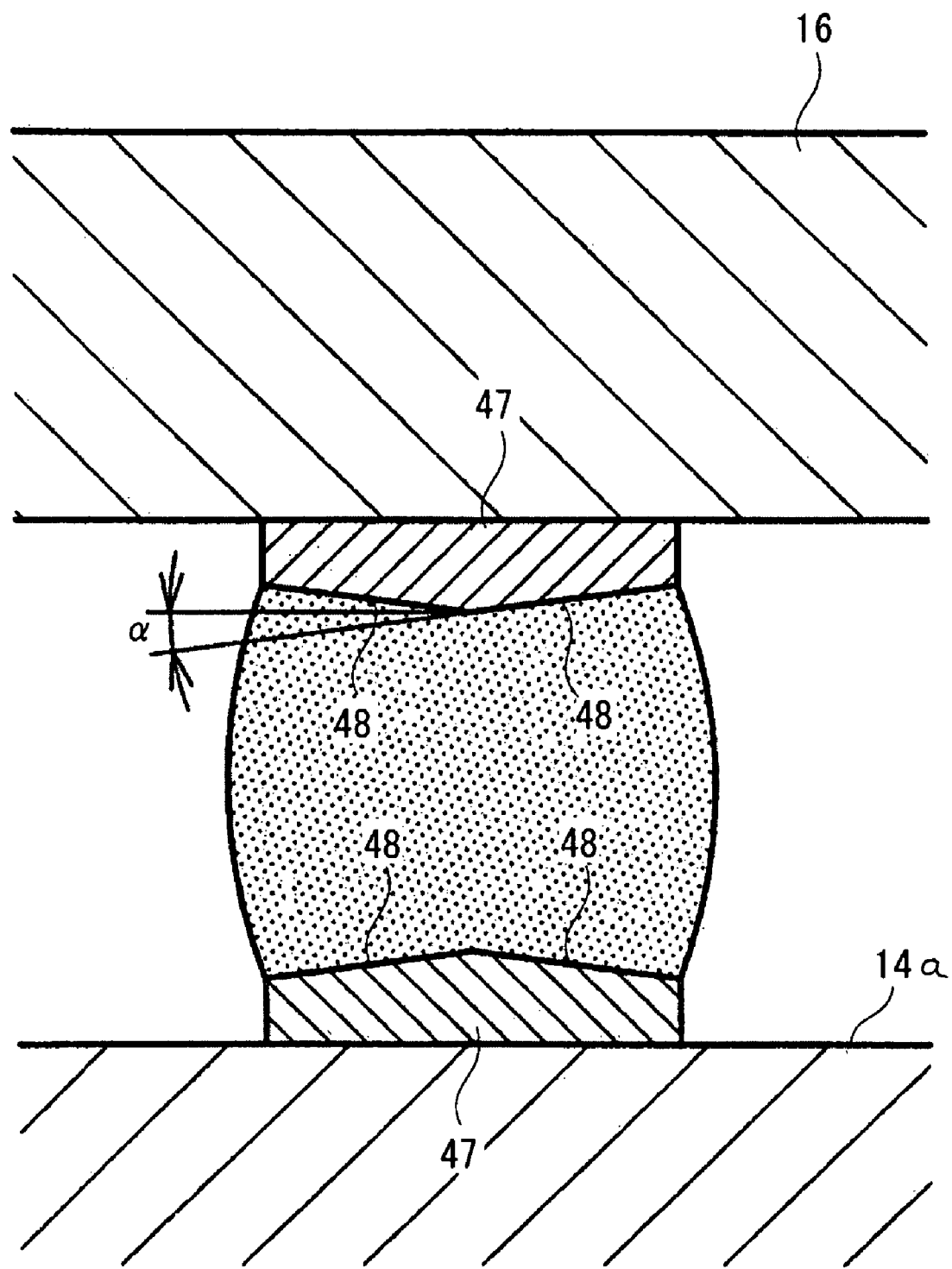
FIG. 14 is an enlarged vertical sectional view of a mother board, schematically depicting conductor pads according to a second embodiment of the invention.
Figure 15:
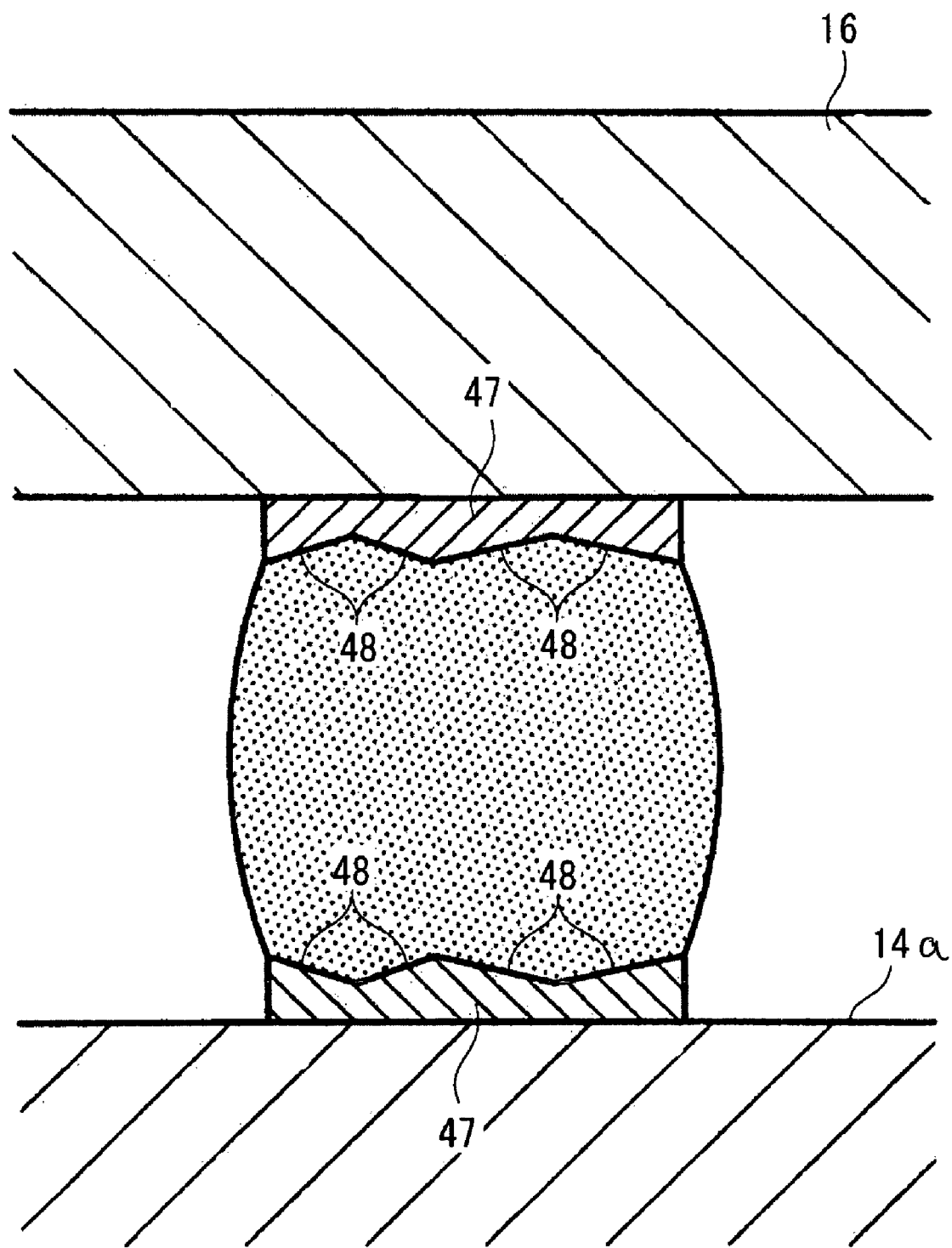
FIG. 15 is an enlarged vertical sectional view of a mother board, schematically depicting conductor pads according to a modification of the second embodiment.

FIG. 14 depicts conductor pads 47 according to a second embodiment of the invention. In the conductor pads 47, inclined surfaces 48 are used to achieve an uneven form. Each inclined surface 48 is inclined at a specific tilt angle α with respect to the flat surface which is the front surface of the printed wiring board 14 or the rear surface of the package board 16. In this embodiment, a quadrangular pyramid with four inclined surfaces 48 is formed as the front surface of each conductor pad 47. For example, the quadrangular pyramid surface may be built up to a height of 0.03 mm. Such conductor pads have the same function and effect as those of the conductor pads 28. Alternatively, as depicted in FIG. 15, the four inclined surfaces 48 may be partitioned by ridgelines perpendicular to directions of expansion and contraction at the time of thermal expansion.

Figure 16:
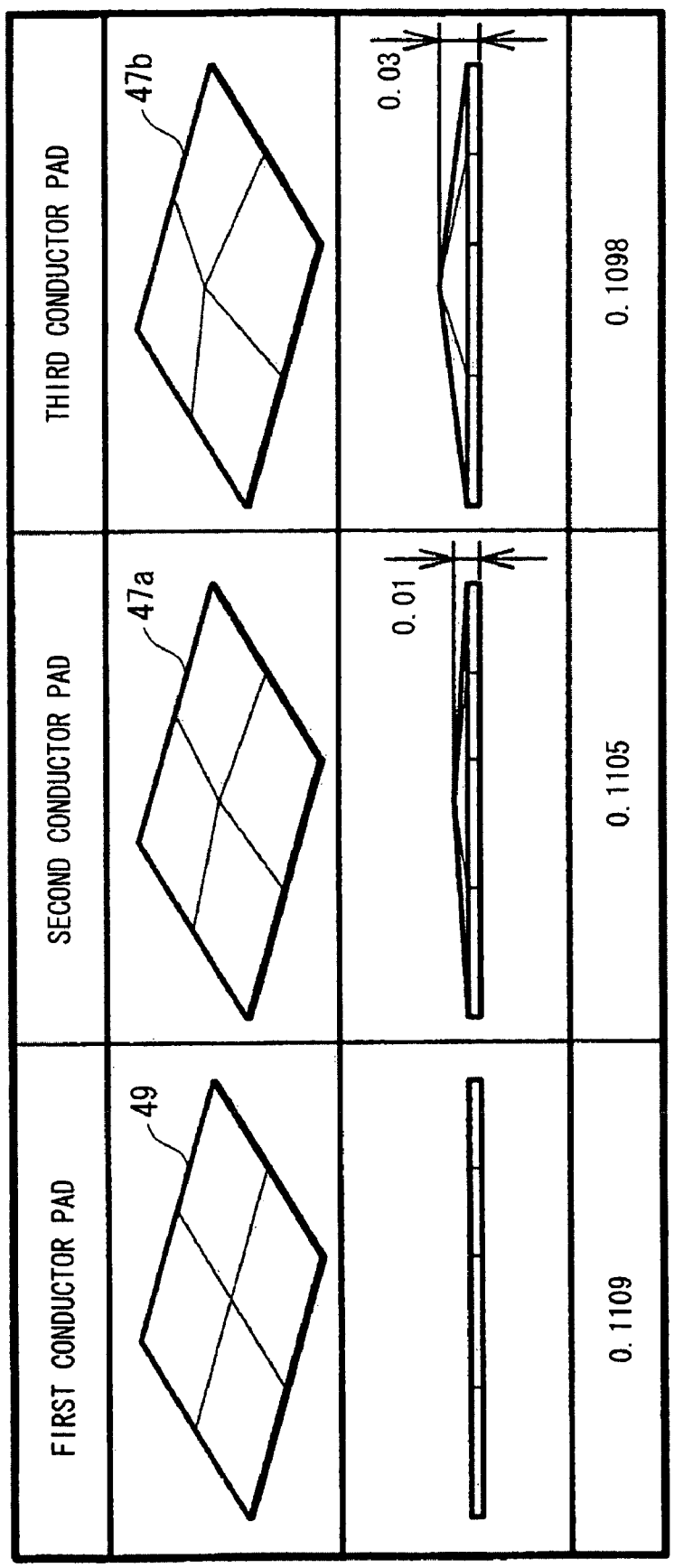
FIG. 16 is a view schematically depicting analytic models for computer simulation.
Figure 17:
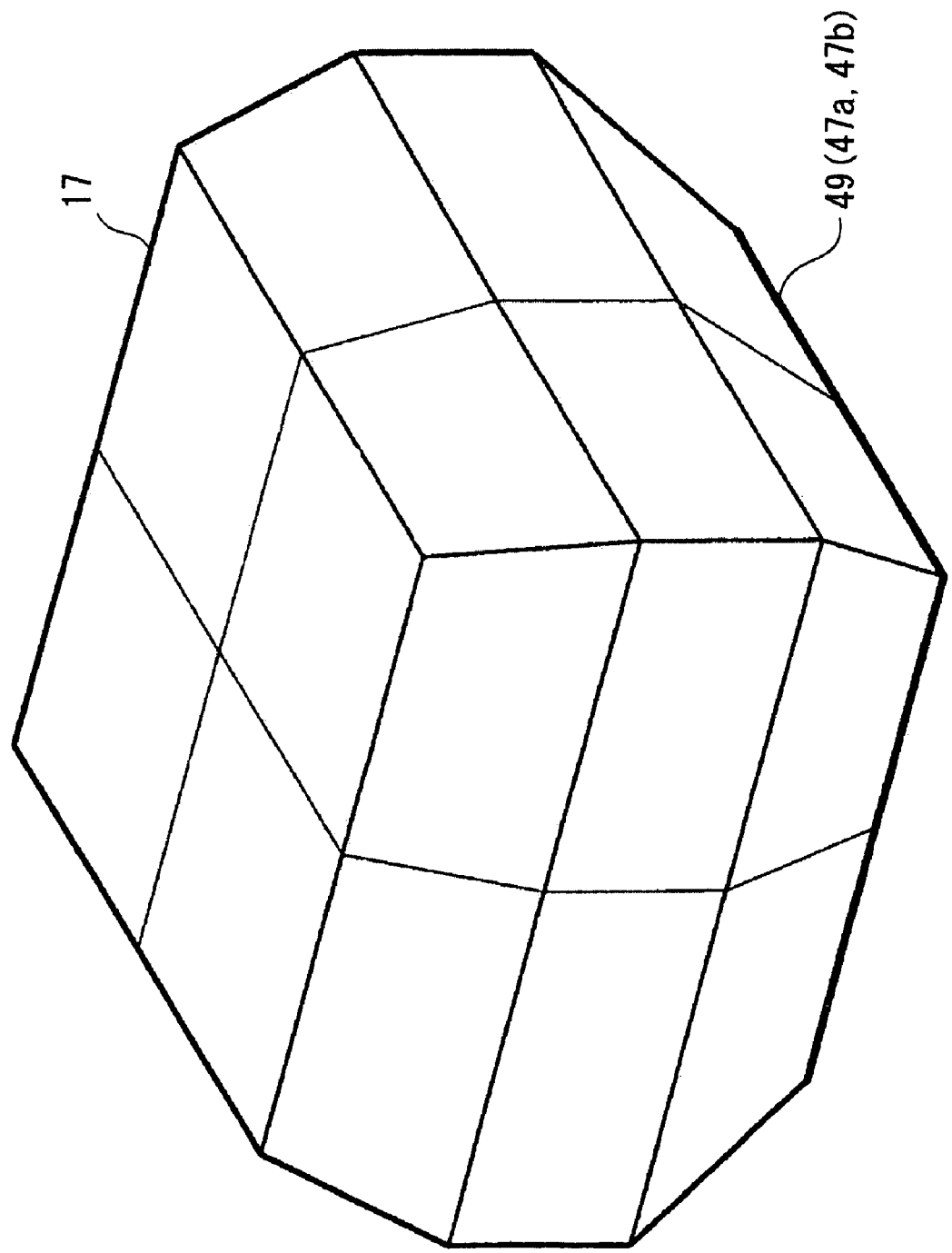
FIG. 17 is a perspective view schematically depicting a terminal bump set by the computer simulation.

A result of verification of the effect of the conductor pads 47 based on computer simulation will be described below. For the simulation, analytic models were created based on the structure of the mother board 13. Three kinds of conductor pads 49, 47*a*, and 47*b* were prepared for the analytic models. The contour of each of the conductor pads 49, 47*a*, and 47*b* was simplified as a quadrangle. The size of each side was set at 0.6 mm. As depicted in FIG. 16, the surface of the first conductor pad 49 was defined as a flat surface. The surface of the second conductor pad 47*a* was defined as a quadrangular pyramid surface. The height of the vertex of the quadrangular pyramid surface was set at 0.01 mm. Similarly, the surface of the third conductor pad 47*b* was defined as a quadrangular pyramid surface. The height of the vertex of the quadrangular pyramid surface was set at 0.03 mm. In the first analytic model, the first conductor pad 49 was applied to all conductor pads. In the second analytic model, the second conductor pad 47*a* was applied to four-corner conductor pads. The first conductor pad 49 was applied to other conductor pads. Similarly, in the third analytic model, the third conductor pad 47*b* was applied to four-corner conductor pads. The first conductor pad 49 was applied to other conductor pads. As depicted in FIG. 17, the shape of each terminal bump 17 was simplified as a polyhedron. Each analytic model was subjected to a thermal cycle test ranging between −25° C., and 125° C. Nonlinear distortion per cycle was measured. In the first analytic model, nonlinear distortion of 0.1109 was confirmed. In the second analytic model, nonlinear distortion of 0.1105 was confirmed. In the third analytic model, nonlinear distortion of 0.1098 was confirmed. As depicted in FIG. 18, it was confirmed that the nonlinear distortion decreased as the vertex of the quadrangular pyramid surface increased. Thus, it was confirmed that the life of the terminal bump 17 increased as the vertex of the quadrangular pyramid surface increased.

The contour of each conductor pad 28 or 47 is not always limited to a circle. For example, the contour of the conductor pad 28 or 47 may be shaped like a polygon such as a hexagon or may be shaped like another figure. It is easily conceivable that the effect of the protrusions 32, 32*a* or 32*b* or the inclined surfaces 48 may be achieved even when the contour of the conductor pad 28 or 47 is shaped like a polygon.

What is claimed is:

1. An electronic device package comprising:
   an electronic device including a plurality of input/output terminals;
   a package board which receives the electronic device on a first surface and includes wiring connected to the input/output terminals of the electronic device; and
   a first connection terminal formed on a second surface of the package board, which is formed on an opposite side of the first surface, and connected to the wiring,
   the first connection terminal is formed with an uneven contact surface to receive a solder material placed thereon,
   the uneven contact surface is formed by inclined flat surfaces which are inclined with respect to the second surface.

2. The electronic device package according to claim 1, wherein a second connection terminal includes flat contact surfaces formed to receive the solder material.

3. An electronic device package comprising:
   an electronic device including a plurality of input/output terminals;
   a package board which receives the electronic device on a first surface and includes wiring connected to the input/output terminals of the electronic device; and
   a first connection terminal formed on a second surface of the package board, which is formed on an opposite side of the first surface, and connected to the wiring,
   the first connection terminal formed with an uneven contact surface to receive a solder material placed thereon,
   the uneven contact surface is formed by inclined flat surfaces which are inclined with respect to the second surface,
   the first connection terminal is disposed in an arrangement separated by a polygon contour.

4. The electronic device package according to claim 1, further comprising:
   a second connection terminal formed on the second surface of the package board, the second connection terminal including a flat contact surface formed to receive a solder material,
   wherein the first connection terminal including uneven contact surface formed to receive the solder material is located in an arrangement around a space of the second surface, and
   the second connection terminal is located around the arrangement of the first connection terminal.

5. A printed wiring board comprising:
   a substrate; and
   a plurality of conductor pads formed on a surface of the substrate;
   at least one of the conductor pads includes an uneven contact surface formed to receive a solder material placed thereon, and
   the uneven contact surface is formed by inclined flat surfaces which are inclined with respect to the second surface.

6. A board unit comprising:
   an electronic device including a plurality of input/output terminals;
   a package board which receives the electronic device on a first surface and includes wiring connected to the input/output terminals of the electronic device;
   a plurality of first connection terminals formed on a second surface of the package board which is formed on an opposite side of the first surface and connected to the wiring;
   a plurality of solder pieces joined to each of the first connection terminals; and
   a printed wiring board including wiring connected to second connection terminals formed on the printed wiring board corresponding to each of the first connection terminal and each joined to the solder pieces, wherein
   a pair of the first and the second connection terminals among the plurality of first connection terminals and the corresponding plurality of second connection terminal pairs includes uneven contact surfaces formed to receive the solder pieces placed thereon,
   the uneven contact surfaces are formed by inclined flat surfaces which are inclined with respect to the second surface.

7. A method of producing a printed wiring board, comprising:
   forming conductor protrusions on a film of a conductor material formed on a surface of package board material so that the conductor protrusions are disposed in positions corresponding to input/output pads;

forming a resist film on the film so that the resist film models a conductor wiring pattern including the input/output pads while the protrusions are covered with the resist film; and removing the film of the conductor material from the periphery of the resist film while leaving the conductor wiring pattern, the conductor protrusions having uneven contact surfaces formed by inclined flat surfaces which are inclined with respect to the wiring board.

8. The method of producing a printed wiring board according to claim 7, further comprising:

preparing the package board including conductor pads disposed on a surface of an insulating board in a certain arrangement;

placing conductor paste on surfaces of the conductor pads; and solidifying the conductor paste on the surfaces of the conductor pads.

\* \* \* \* \*